(12) United States Patent
Tu et al.

(10) Patent No.: US 6,486,033 B1
(45) Date of Patent: Nov. 26, 2002

(54) SAC METHOD FOR EMBEDDED DRAM DEVICES

(75) Inventors: Kuo-Chi Tu; Wan-Yih Lieh, both of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/808,927

(22) Filed: Mar. 16, 2001

(51) Int. Cl.⁷ .......................................... H01L 21/8234
(52) U.S. Cl. ..................... 438/275; 438/229; 438/672
(58) Field of Search ............................... 438/229–233, 438/275, 299, 618, 620, 672, 675

(56) References Cited

U.S. PATENT DOCUMENTS

| | | | |
|---|---|---|---|
| 5,633,188 A | 5/1997 | Ogawa | 438/396 |
| 5,798,289 A | 8/1998 | Ajika et al. | 438/239 |
| 5,863,820 A * | 1/1999 | Huang | 438/241 |
| 5,998,251 A | 12/1999 | Wu et al. | 438/241 |
| 6,004,843 A * | 12/1999 | Huang | 438/241 |
| 6,069,037 A | 5/2000 | Liao | 438/241 |
| 6,069,038 A * | 5/2000 | Hashimoto et al. | 438/235 |
| 6,074,908 A | 6/2000 | Huang | 438/241 |
| 6,117,725 A | 9/2000 | Huang | 438/241 |
| 6,127,260 A | 10/2000 | Huang | 438/629 |
| 6,168,984 B1 * | 1/2001 | Yoo et al. | 438/239 |

* cited by examiner

Primary Examiner—Carl Whitehead, Jr.
Assistant Examiner—Jamie L. Brophy
(74) Attorney, Agent, or Firm—George O. Saile; Stephen B. Ackerman; Rosemary L.S. Pike

(57) ABSTRACT

A method for forming logic circuits with embedded memory is described. Isolation areas are formed on a semiconductor substrate separating at least one logic area and at least one memory area. Gate electrode stacks comprising a polysilicon layer, a silicide layer, a first oxide layer, and a first nitride layer are formed in the device areas. The semiconductor substrate and the gate electrode stacks are covered with a first mask. The first mask in the logic areas is partially removed to expose the first nitride layer. The first nitride layer is removed to expose the first oxide layer in the logic areas. The first mask is removed. Processing continues to form LDD regions, S/D regions in the logic areas, and memory devices in the memory areas. Since the first nitride layer in the logic areas has been removed, an etching with an etch stop at nitride can form metal contacts in the logic areas and memory areas simultaneously. No substrate loss is seen in the S/D region of the logic areas and metal shorting of the contact to the gate is avoided even with mask misalignment because of the etch stop at the nitride in the memory area.

27 Claims, 9 Drawing Sheets

SAC METHOD FOR EMBEDDED DRAM DEVICES

BACKGROUND OF THE INVENTION (1) Field of the Invention

The present invention relates to the fabrication of integrated circuit devices, and more particularly, to a method of removing the gate silicon nitride in the logic area of an embedded DRAM for improved self-aligned contact (SAC) processing in the fabrication of integrated circuits.

(2) Description of the Prior Art

In the fabrication of integrated circuit devices, embedded dynamic random access (DRAM) devices have both memory cells and logic cells formed on a single silicon chip. Embedded DRAM is capable of transferring large quantities of data at very high speeds. A gate silicon nitride capping layer is required for the DRAM source/drain regions and self-aligned contact formation. However, the silicon nitride capping layer limits DRAM capacitor size and SAC size. Furthermore, metal contact etching through the thick silicon nitride layer on top of the gate is a challenge due to serious substrate loss in the source/drain regions.

For example, FIG. 1 illustrates the logic portion of a partially completed integrated circuit device. Gate electrodes comprise a polysilicon layer 16, an overlying silicide layer 18, a capping oxide layer 20, and a capping silicon nitride layer 22. Silicon nitride sidewall spacers 24 and silicon nitride liner layer 28 have also been formed on the gate electrodes, as shown. The DRAM portion of the integrated circuit device, not shown, needs the silicon nitride layers in order to form self-aligned contacts. However, in the logic portion shown in FIG. 1, in order for the metal contact 34 to contact the silicide layer 18, the contact opening must be etched through the thick silicon nitride layer 28/22. This results in overetching of the contact 38 into the silicon substrate, as shown by 40.

FIG. 2 shows an example of another problem in the prior art. A DRAM portion of a partially completed integrated circuit device is shown in FIG. 2. As in the logic portion shown in FIG. 1, gate electrodes comprise a polysilicon layer 16, an overlying silicide layer 18, a capping oxide layer 20, and a capping silicon nitride layer 22. Silicon nitride liner layer 28 has also been formed over the gate electrodes. Self-aligned contact openings are made through the dielectric layer 30 to node contacts 32. These openings are filled, for example, with polysilicon plugs 42. If there is misalignment during patterning of the metal contact opening, the opening will be etched through the silicon nitride capping layer 22 and the oxide layer 20, causing a short 60 to the gate. A possible solution to this problem is to enlarge the polysilicon plug 42, as shown by dotted lines 63. However, this solution will limit capacitor size, as shown by 65.

It is desired to provide a process for forming metal contacts in both the logic and DRAM regions simultaneously while avoiding serious substrate loss in the logic area and preventing metal contact shorting to the gate without increasing SAC size.

U.S. Pat. No. 6,074,908 to Huang, U.S. Pat. No. 5,998,251 to Wu et al, U.S. Pat. No. 6,117,725 to Huang, and U.S. Pat. No. 6,069,037 to Liao disclose various embedded DRAM processes. U.S. Pat. No. 5,633,188 to Ogawa, U.S. Pat. No. 5,798,289 to Ajika et al, and U.S. Pat. No. 6,127,260 to Huang disclose various DRAM and other memory processes.

SUMMARY OF THE INVENTION

Accordingly, it is a primary object of the present invention to provide an effective and very manufacturable method for forming embedded DRAM devices in the fabrication of integrated circuits.

It is a further object of the invention to provide a process for forming metal contacts simultaneously in both logic and memory areas in the fabrication of integrated circuits.

Another object is to remove the capping silicon nitride layer in the logic area to increase the metal contact etching process window in the fabrication of logic devices with embedded memory.

Yet another object is to provide a process for forming metal contacts in both the logic and DRAM regions simultaneously while avoiding serious substrate loss in the logic area and preventing metal contact shorting to the gate without increasing SAC size.

In accordance with the objects of the invention, a method for forming logic circuits with embedded memory is achieved. Isolation regions are formed in and on a semiconductor substrate separating active areas wherein active areas comprise at least one logic area and at least one memory area. Gate electrode stacks are formed in the active areas comprising a polysilicon layer, a silicide layer, a first oxide layer, and a first nitride layer. The semiconductor substrate and gate electrode stacks are covered with a first mask layer. The first mask layer is partially removed in the logic areas to expose the first nitride layer. The exposed first nitride layer is removed to expose the first oxide layer in the logic areas. The first mask layer is removed in both logic and memory areas. Lightly doped regions are formed. Nitride spacers are formed on the gate electrode stacks in the logic areas. Source/drain regions are formed in the logic areas. A second nitride layer is deposited overlying the logic areas and memory areas. A second oxide layer is formed overlying the second nitride layer. Memory devices are formed in the memory areas. Contact openings are etched simultaneously through the second oxide layer in both the logic and memory areas. The contact openings are filled with a metal layer to complete fabrication of the integrated circuit device.

More particularly, in accordance with the objects of the invention, a method for forming logic circuits with embedded memory is achieved. Isolation areas are formed on a semiconductor substrate surrounding and electrically isolating device areas which include at least one logic device area and at least one memory device area. Gate electrode stacks are formed in the device areas wherein the gate electrode stacks comprise a first polysilicon layer, an overlying silicide layer, an overlying first oxide layer, and a topmost capping silicon nitride layer. The semiconductor substrate and the gate electrode stacks are covered with a photoresist layer. The memory areas are covered with a mask. The photoresist layer in the logic areas not covered by the mask is exposed to low energy. The exposed photoresist layer in the logic areas is partially developed away to a height approximately equal to the height of the topmost capping silicon nitride layer. The topmost capping silicon nitride layer is etched away in the logic areas. The photoresist layer is removed in both the logic areas and the memory areas. Lightly doped regions are implanted in both the logic areas and the memory areas. A first silicon nitride layer is deposited over the semiconductor substrate and the gate electrode stacks and etched away in the logic areas to form silicon nitride sidewalls on the gate electrode stacks in the logic areas. Thereafter, heavily doped source and drain regions are implanted in the logic areas. A second silicon nitride layer is deposited overlying the gate stacks and the silicon nitride sidewalls in the logic areas and overlying the first silicon nitride layer in the memory areas. The gate stacks are covered with a second oxide layer. Memory devices, such as polysilicon plugs and capacitors are formed in the memory areas. The second oxide layer and the memory devices are covered with a third oxide layer. Contact openings are simultaneously etched through the second and third oxide layers in both the logic areas and the memory areas wherein the etching has an etch stop at silicon nitride. The contact openings are filled with a first metal layer to complete fabrication of an integrated circuit device having logic and memory cells on a single semiconductor substrate.

BRIEF DESCRIPTION OF THE DRAWINGS

In the accompanying drawings forming a material part of this description, there is shown.

DESCRIPTION OF THE PREFERRED EMBODIMENTS

Figures 1, 2:
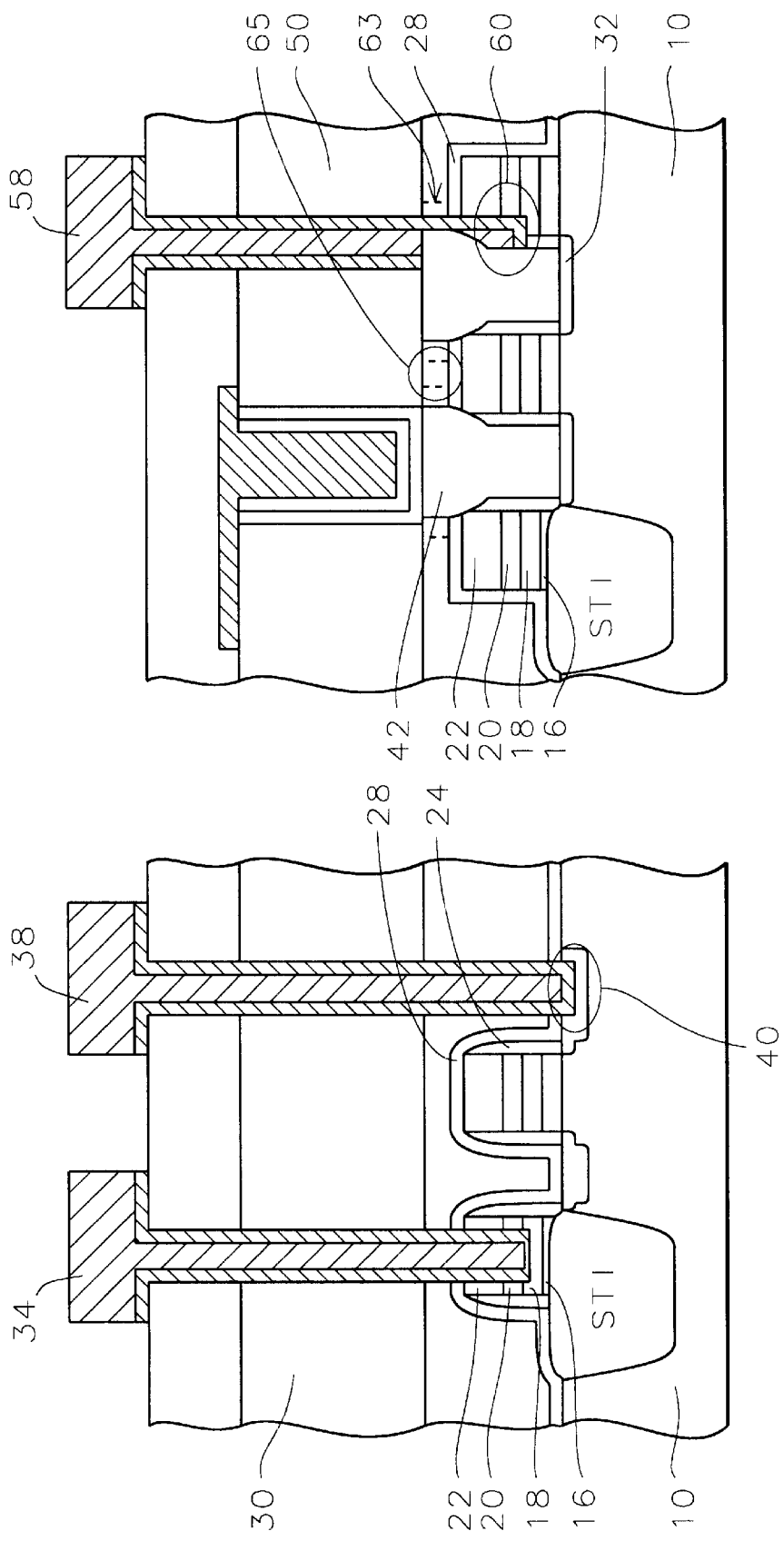
FIGS. 1 and 2 are cross-sectional representations of problems since in the prior art.
Figure 3:
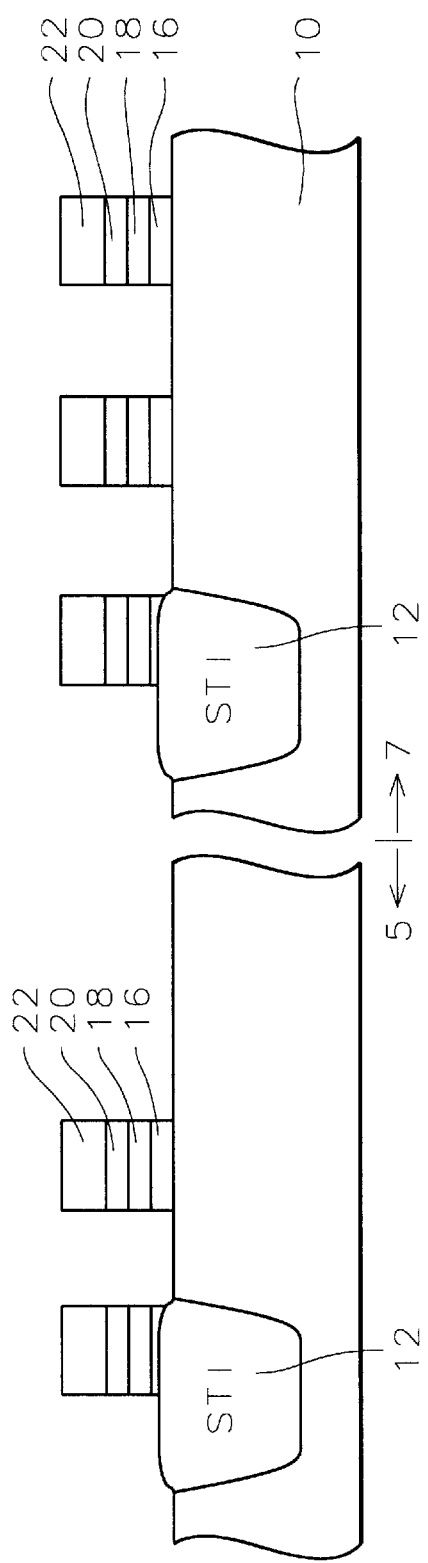
FIGS. 3 through 10 are cross-sectional representations of a preferred embodiment of the present invention.

Referring now more particularly to FIG. 3, there is shown a semiconductor substrate 10, preferably composed of monocrystalline silicon. Isolation regions, such as shallow trench isolation (STI) regions 12 may be formed as is conventional in the art. The substrate is shown to be divided into a logic side 5 on the left and a memory side 7 on the right. The chip is depicted in this way for clarity. It is to be understood that the chip layout can be other than that depicted. The important point is that both logic and memory devices are to be fabricated on the same wafer.

First, a layer of gate oxide, not shown, is grown over the surface of the substrate, typically to a thickness of between about 40 and 80 Angstroms. A layer of polysilicon 16 is deposited over the gate oxide and STI regions to a thickness of between about 500 and 1000 Angstroms. A silicide layer 18, such as tungsten silicide, is formed over the polysilicon layer to a thickness of between about 500 and 1000 Angstroms. An oxide layer 20, such as tetraethoxysilane (TEOS) is formed over the silicide layer to a thickness of between about 800 and 1500 Angstroms. Next, a layer of silicon nitride 22 is deposited over the oxide layer to a thickness of between about 500 and 1500 Angstroms.

The silicon nitride, oxide, silicide, and polysilicon layers are patterned and etched to form gate electrodes as shown in both the logic area 5 and the memory area 7. The memory devices may be word lines in a dynamic random access memory (DRAM) cell or pass-gate or pull-down transistors in a static random access memory (SRAM) cell, for example. Optionally, an LDD implant may be made at this time to form lightly doped regions 36.

Figure 4:
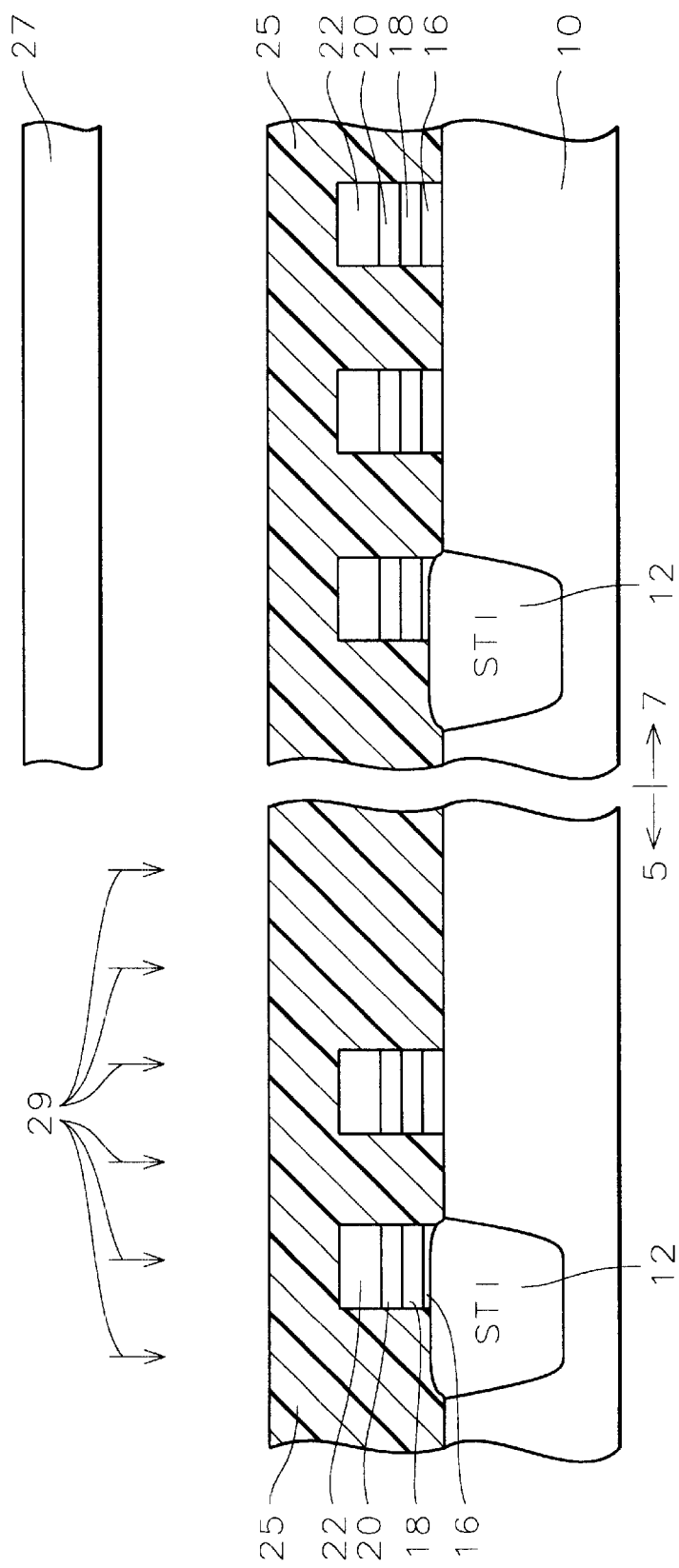

Referring now to FIG. 4, a key feature of the present invention will be described. The wafer is coated with a photoresist layer 25. A mask 27 covers the memory area 7, as shown. Then, the photoresist in the logic area 5 (and the memory periphery area, not shown) is exposed to a low energy of between about 100 and 200 millijoules 29. This low energy exposure will allow partial development of the photoresist in the logic area 5.

Figure 5:
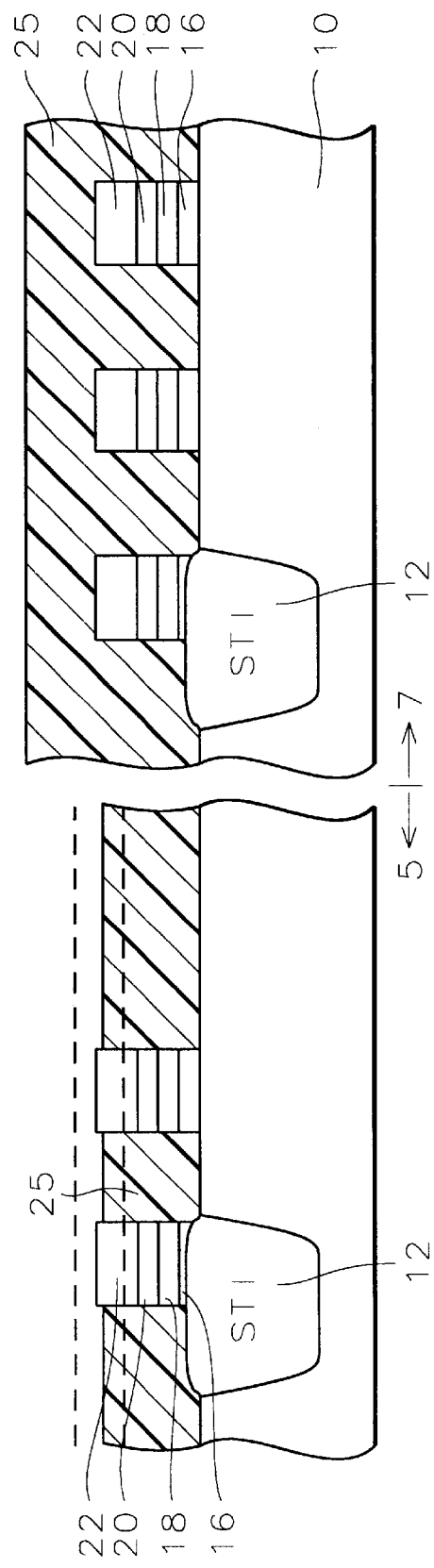
Figure 6:
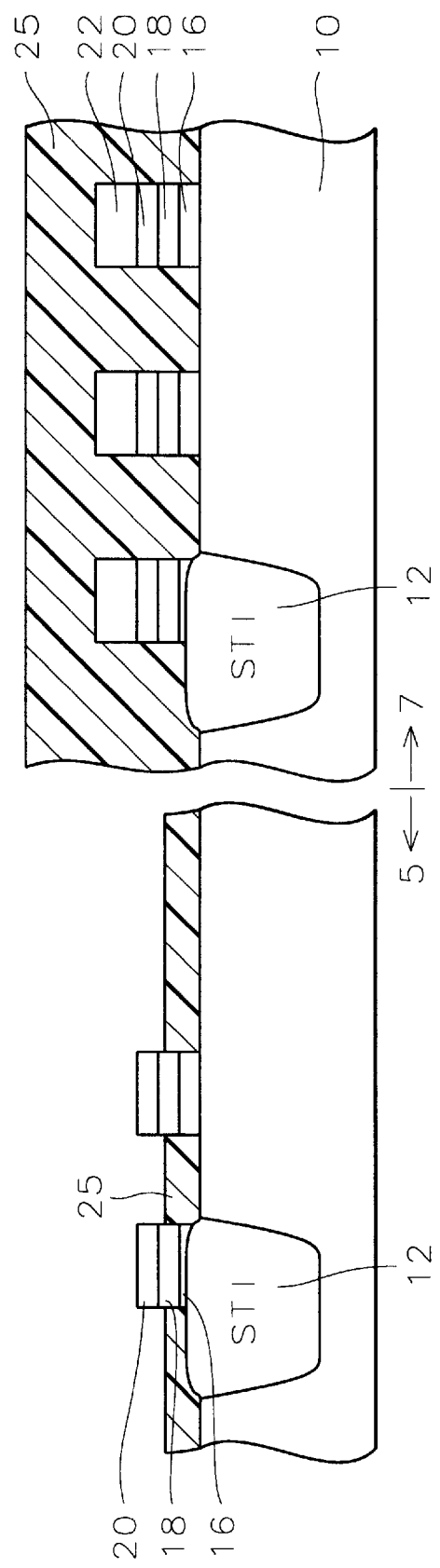

Referring now to FIG. 5, the exposed photoresist in the logic area 5 is developed away. The remaining unexposed photoresist in the logic area 5 will be slightly below to slightly above the top of the silicon nitride layer 22. The allowance variation of the photoresist height is illustrated by the dotted lines.

It will be understood by those skilled in the art that other masking techniques can be used to expose the silicon nitride layer 22 in the logic areas. The present invention is not limited to the low energy photoresist exposure and development illustrated herein.

Now, a dry etching is performed to remove the silicon nitride layer 22. This etching may also remove the oxide layer 20. However, since it is preferred that the oxide layer 20 remain on the gate stacks, this option is illustrated in the drawings. The remaining photoresist 25 protects the silicon substrate from the etching.

Figure 7:
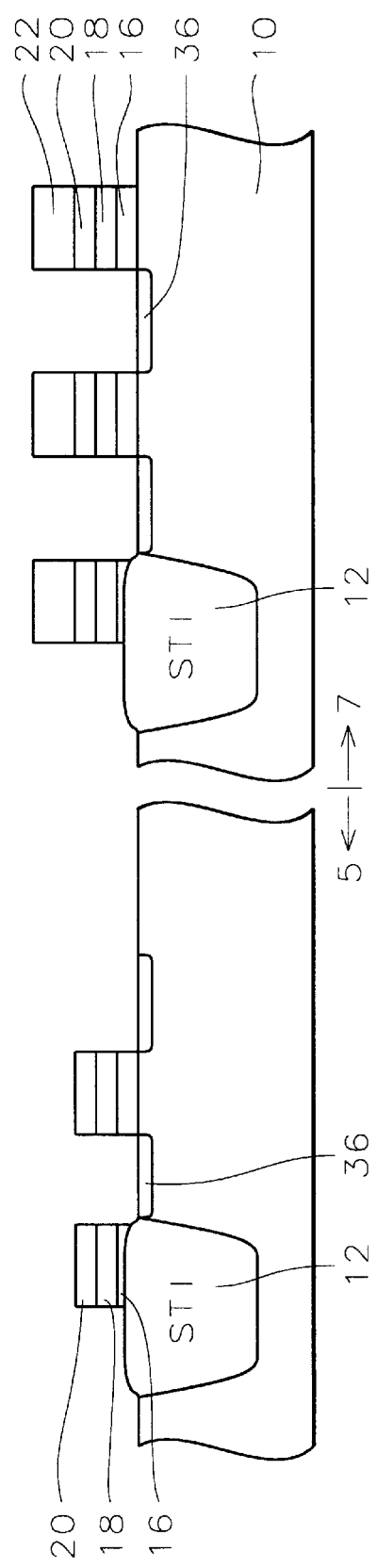

The photoresist 25 is now removed, as shown in FIG. 7. An LDD implant to form the transistor lightly doped regions 36 is performed at this time, if not earlier, in both the logic and memory areas.

Figure 8:
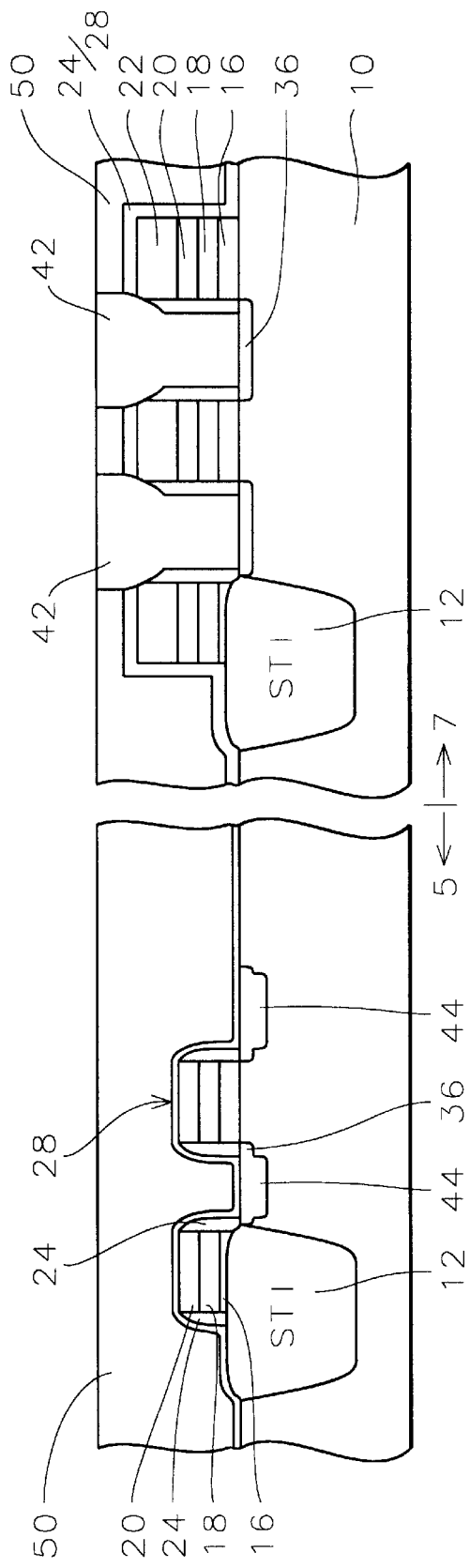

Referring now to FIG. 8, a first silicon nitride layer is deposited over the surface of the substrate to a thickness of between about 300 and 500 Angstroms. Next, the memory area 7 is masked, not shown. The first silicon nitride layer is anisotropically etched back in the logic area 5 to form spacers 24 on the sidewalls of the gate electrodes. Heavily doped ion implants are performed to form source/drain regions 44 in the logic area 5. The mask is removed. A second silicon nitride liner layer 28 is deposited over the surface of the substrate to a thickness of between about 100 and 200 Angstroms.

A layer of interpoly oxide 50 is deposited over the substrate to a thickness of between about 4000 and 6000 Angstroms. The interpoly oxide may be high density plasma chemically vapor deposited oxide (HDP-CVD), borophosphosilicate glass (BPSG), or the like, for example. Conventional photolithography and etching are used to form self-aligned contact openings to the node contact regions 36 in the memory area 7. Polysilicon plugs 42 fill the contact openings, as shown in FIG. 8.

Now, the capacitor is to be fabricated in the memory area 7. For example, a second layer of interpoly oxide 52 is deposited over the substrate to a thickness of between about 10,000 and 20,000 Angstroms. A trench may be opened through the IPO layer 52 to one of the polysilicon plugs 42. A capacitor may be formed within this trench. For example, a thin conformal layer of polysilicon 54 may be deposited within the trench. Together with the polysilicon plug 42, the polysilicon 54 forms the bottom capacitor plate electrode. A capacitor dielectric layer 56 is deposited overlying the polysilicon layer 54. For example, the capacitor dielectric layer may be oxide-nitride-oxide (ONO). Finally, a thick polysilicon layer is deposited over the IPO layer and filling the trench. This layer is patterned to form the top plate electrode 70, as shown.

Figure 9:
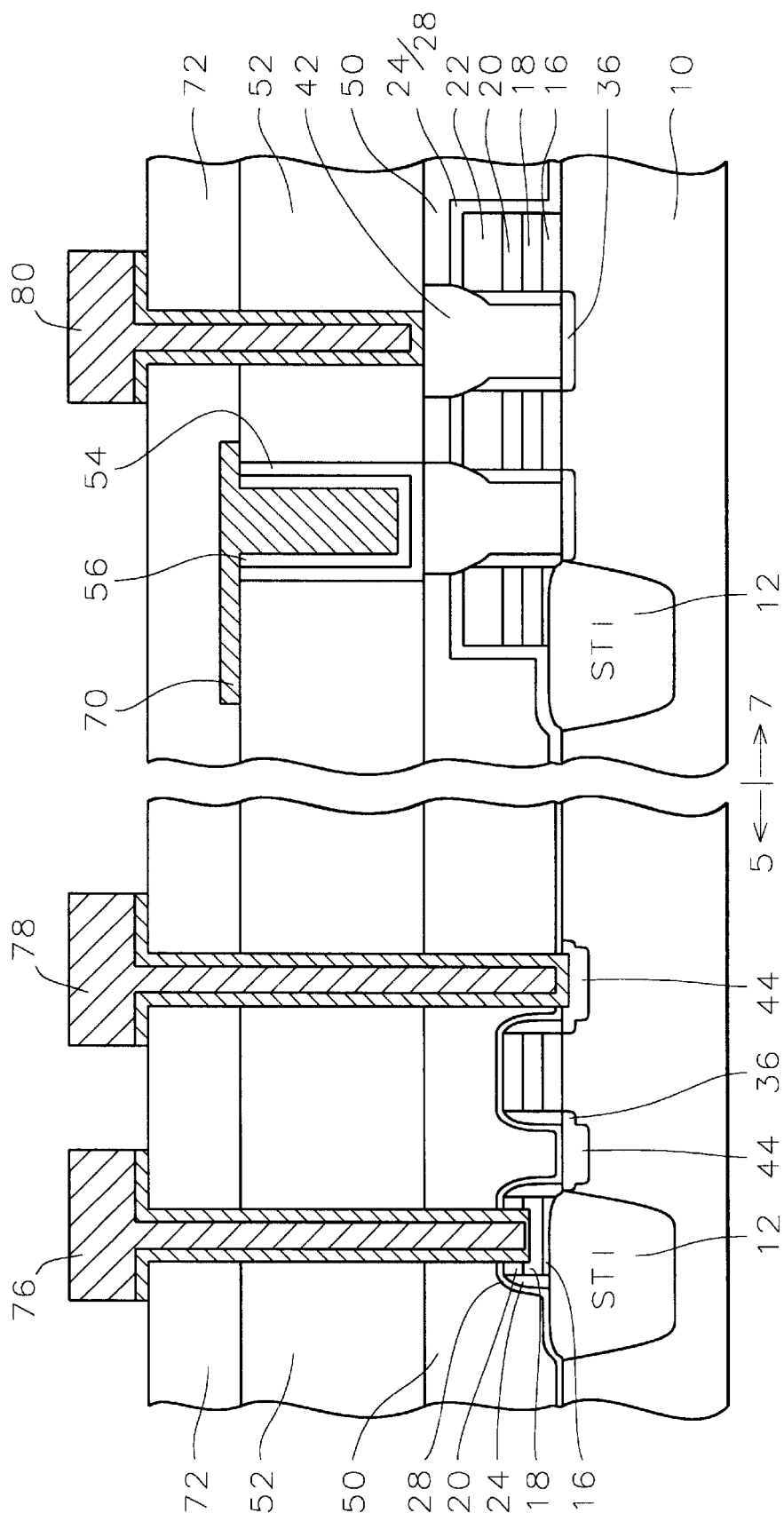

Now, metal interconnections or bit lines are to be formed in both the memory and logic areas. A third IPO layer 72 is deposited over the substrate to a thickness of between about 3000 and 4000 Angstroms. As shown in FIG. 9, bit line contact openings are made, for example, to a gate 16/18 and a source/drain region 44 in the logic area 5 and to a polysilicon plug 42 in the memory 7. Since the silicon nitride gate capping layer 22 was removed from the logic area, the etching process to open the bit line contacts must etch through only the interpoly oxide layers and the thin silicon nitride liner layer 28. This results in no serious substrate loss, as shown. Bit lines 76, 78, and 80 are completed as is conventional in the art. For example, a barrier metal layer may be deposited within the openings, followed by a metal layer to fill the openings. After the metal layer is planarized, a second barrier metal layer and a second metal layer are deposited and patterned to complete the bit lines, as shown.

Figure 10:
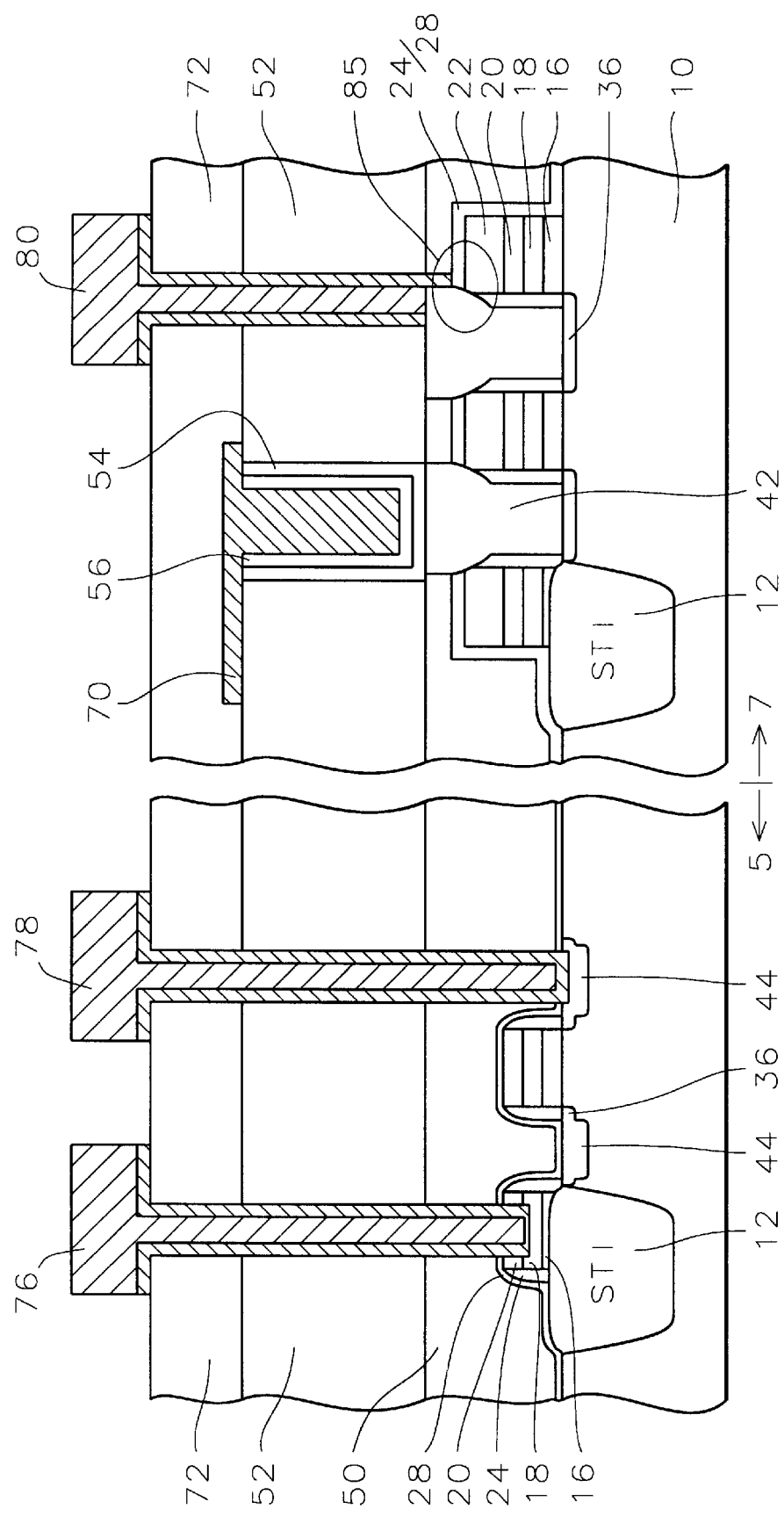

FIG. 10 illustrates the instance in which the bit line contact mask is misaligned in the memory area 7. Although the bit line opening falls partially outside the polysilicon plug 42, there is no short to the gate. This is because the etching process to open the bit line contacts etches through the oxide layers with an etch stop at silicon nitride. The thin silicon nitride layer 28 in the logic area is etched through by this process, but the thick silicon nitride layer 22/24/28 in the memory area is not etched through (see 85).

The process of the present invention provides a process for forming metal contacts in both the logic and DRAM regions simultaneously while avoiding serious substrate loss in the logic area and preventing metal contact shorting to the gate without increasing SAC size. The key feature of the present invention is the removal of the silicon nitride gate capping layer in the logic area and in the DRAM periphery area. This approach increases the process window for metal contact etching and provides spacing between the SAC and the capacitor.

While the invention has been particularly shown and described with reference to the preferred embodiments thereof, it will be understood by those skilled in the art that various changes in form and details may be made without departing from the spirit and scope of the invention.

What is claimed is:

1. A method for fabricating an integrated circuit device having logic and memory cells on a single semiconductor substrate comprising:
    forming isolation regions in and on said semiconductor substrate separating active areas wherein said active areas comprise at least one logic area and at least one memory area;
    forming gate electrode stacks in said active areas wherein said gate electrode stacks comprise a polysilicon layer, a silicide layer, a first oxide layer, and a first nitride layer;
    covering said semiconductor substrate and said gate electrode stacks with a first mask layer;
    exposing said first mask in said logic areas to a low energy exposure wherein said first mask layer is partially removed in said logic areas to expose said first nitride layer;
    removing said exposed first nitride layer to expose said first oxide layer in said logic areas;
    removing said first mask layer in both said logic areas and said memory areas;
    forming lightly doped regions;
    forming nitride spacers on said gate electrode stacks in said logic areas;
    forming source/drain regions in said logic areas;
    depositing a second nitride layer overlying said logic areas and said memory areas;
    forming a second oxide layer overlying said second nitride layer;
    forming memory devices in said memory areas;
    simultaneously etching contact openings through said second oxide layer in both said logic areas and said memory areas; and
    filling said contact openings with a metal layer to complete fabrication of said integrated circuit device having logic and memory cells on a single semiconductor substrate.

2. The method according to claim 1 further comprising applying a second mask to cover said first mask in said memory area prior to said step of partially removing said first mask layer in said logic area.

3. The method according to claim 1 wherein said first mask comprises photoresist.

4. The method according to claim 1 wherein said first nitride layer has a thickness of between about 500 and 1500 Angstroms.

5. The method according to claim 1 wherein said low energy exposure comprises 100 to 150 mj.

6. The method according to claim 1 wherein said step of removing said exposed first nitride layer in said logic areas comprises a dry etching process.

7. The method according to claim 6 further comprising etching away said first oxide layer underlying said exposed first nitride layer in said logic areas after said step of removing said exposed first nitride layer.

8. The method according to claim 1 wherein said step of forming memory devices in said memory areas comprises:
    forming polysilicon plugs in said memory areas wherein said polysilicon plugs extend through said second oxide layer to an underlying said lightly doped region;
    covering said second oxide layer and said polysilicon plugs with a third oxide layer; and
    forming a capacitor wherein said capacitor extends through said third oxide layer to contact one of said polysilicon plugs.

9. The method according to claim 1 wherein said contact openings in said logic areas contact one of said gate electrode stacks and one of said source/drain regions.

10. The method according to claim 1 further comprising depositing a second metal layer overlying said second oxide layer and said metal layer filling said contact openings and patterning said second metal layer to form bit lines.

11. A method for fabricating an integrated circuit device having logic and memory cells on a single semiconductor substrate comprising:
    forming isolation regions in and on said semiconductor substrate separating active areas wherein said active areas comprise at least one logic area and at least one memory area;
    forming gate electrode stacks in said active areas wherein said gate electrode stacks comprise a first polysilicon layer, an overlying silicide layer, an overlying first oxide layer, and a topmost capping silicon nitride layer;
    covering said semiconductor substrate and said gate electrode stacks with a photoresist layer;
    covering said memory areas with a mask;
    exposing said photoresist layer in said logic areas not covered by said mask to a low energy exposure;
    partially developing away exposed said photoresist layer in said logic areas to a height approximately equal to the height of said topmost capping silicon nitride layer;
    etching away said topmost capping silicon nitride layer in said logic areas;
    thereafter removing said photoresist layer in both said logic areas and said memory areas;
    implanting lightly doped regions in both said logic areas and said memory areas;
    depositing a first silicon nitride layer over said semiconductor substrate and said gate electrode stacks;
    etching said first silicon nitride layer in said logic areas to form silicon nitride sidewalls on said gate electrode stacks in said logic areas;

thereafter implanting heavily doped source and drain regions in said logic areas;

depositing a second silicon nitride layer overlying said gate stacks and said silicon nitride sidewalls in said logic areas and overlying said first silicon nitride layer in said memory areas;

covering said gate stacks with a second oxide 40 layer;

forming polysilicon plugs in said memory areas wherein said polysilicon plugs extend through said second oxide layer to an underlying said lightly doped region;

covering said second oxide layer and said polysilicon plugs with a third oxide layer;

forming a capacitor wherein said capacitor extends through said third oxide layer to contact one of said polysilicon plugs;

covering said third oxide layer and said capacitor with a fourth oxide layer;

simultaneously etching contact openings through said second, third, and fourth oxide layers in both said logic areas and said memory areas wherein said etching said contact openings has an etch stop; and filling said contact openings with a first metal layer to complete fabrication of said integrated circuit device having logic and memory cells on a single silicon chip.

12. The method according to claim 11 wherein said topmost silicon nitride capping layer has a thickness of between about 500 and 1000 Angstroms.

13. The method according to claim 11 wherein said low energy exposure comprises 100 to 150 mj.

14. The method according to claim 11 wherein said step of etching away said topmost capping silicon nitride layer in said logic areas comprises a dry etching process.

15. The method according to claim 11 further comprising etching away said first oxide layer underlying said topmost capping silicon nitride layer in said logic areas after said step of etching away said topmost capping silicon nitride layer.

16. The method according to claim 11 wherein said contact openings in said logic areas contact one of said gate electrode stacks and one of said heavily doped source and drain regions and wherein said etching said contact openings with said etch stop etches through said second silicon nitride layer in said logic areas but not through thicker combined said first and second silicon nitride layers and said topmost capping silicon nitride layer in said memory areas without damage to underlying layers.

17. The method according to claim 11 wherein said step of forming said polysilicon plugs comprises:

opening self-aligned contact openings between said gate electrode stacks;

filling said self-aligned contact openings with a polysilicon layer; and removing said polysilicon layer except where it fills said self-aligned contact openings to form said polysilicon plugs.

18. The method according to claim 11 wherein said contact openings in said memory areas contact one of said polysilicon plugs and wherein if said contact opening is misaligned said etching of said contacts openings will not etch through all of said first and second silicon nitride layers and said topmost silicon nitride capping layer of said gate electrode stack so as not to short said first metal layer within said contact openings to said gate electrode stack.

19. The method according to claim 11 further comprising depositing a second metal layer overlying said third oxide layer and said first metal layer filling said contact openings and patterning said second metal layer to form bit lines.

20. A method for fabricating an integrated circuit device having logic and memory cells on a single semiconductor substrate comprising:

forming isolation regions in and on said semiconductor substrate separating active areas wherein said active areas comprise at least one logic area and at least one memory area;

forming gate electrode stacks in said active areas wherein said gate electrode stacks comprise a first polysilicon layer, an overlying silicide layer, an overlying first oxide layer, and a topmost capping silicon nitride layer;

covering said semiconductor substrate and said gate electrode stacks with a photoresist layer;

covering said memory areas with a mask;

exposing said photoresist layer in said logic areas not covered by said mask to a low energy exposure;

partially developing away exposed said photoresist layer in said logic areas to a height approximately equal to the height of said topmost capping silicon nitride layer;

etching away said topmost capping silicon nitride layer in said logic areas;

thereafter removing said photoresist layer in both said logic areas and said memory areas;

implanting lightly doped regions in both said logic areas and said memory areas;

depositing a first silicon nitride layer over said semiconductor substrate and said gate electrode stacks;

etching said first silicon nitride layer in said logic areas to form silicon nitride sidewalls on said gate electrode stacks in said logic areas;

thereafter implanting heavily doped source and drain regions in said logic areas;

depositing a second silicon nitride layer overlying said gate stacks and said silicon nitride sidewalls in said logic areas and overlying said first silicon nitride layer in said memory areas;

covering said gate stacks with a second oxide layer;

opening self-aligned contact openings to an underlying said lightly doped region between said gate electrode stacks in said memory areas;

filling said self-aligned contact openings with a polysilicon layer;

removing said polysilicon layer except where it fills said self-aligned contact openings to form polysilicon plugs;

covering said second oxide layer and said polysilicon plugs with a third oxide layer;

forming a capacitor wherein said capacitor extends through said third oxide layer to contact one of said polysilicon plugs;

covering said third oxide layer and said capacitor with a fourth oxide layer;

simultaneously etching contact openings through said second, third, and fourth oxide layers in both said logic areas and said memory areas wherein said etching said contact openings has an etch stop; and filling said contact openings with a first metal layer to complete fabrication of said integrated circuit device having logic and memory cells on a single silicon chip.

21. The method according to claim 20 wherein said topmost silicon nitride capping layer has a thickness of between about 500 and 1000 Angstroms.

22. The method according to claim 20 wherein said low energy exposure comprises 100 to 150 mj.

23. The method according to claim 20 wherein said step of etching away said topmost capping silicon nitride layer in said logic areas comprises a dry etching process.

24. The method according to claim 20 further comprising etching away said first oxide layer underlying said topmost capping silicon nitride layer in said logic areas after said step of etching away said topmost capping silicon nitride layer.

25. The method according to claim 20 wherein said contact openings in said logic areas contact one of said gate electrode stacks and one of said heavily doped source and drain regions and wherein said etching said contact openings with said etch stop etches through said second silicon nitride layer in said logic areas but not through thicker combined said first and second silicon nitride layers and said topmost capping silicon nitride layer in said memory areas without damage to underlying layers.

26. The method according to claim 20 wherein said contact openings in said memory areas contact one of said polysilicon plugs and wherein if said contact opening is misaligned said etching will not etch through all of said first and second silicon nitride layers and said topmost silicon nitride capping layer of said gate electrode stack so as not to short said first metal layer within said contact openings to said gate electrode stack.

27. The method according to claim 20 further comprising depositing a second metal layer overlying said third oxide layer and said first metal layer filling said contact openings and patterning said second metal layer to form bit lines.

* * * * *